(12) United States Patent
Ok et al.

(10) Patent No.: US 11,659,780 B2
(45) Date of Patent: May 23, 2023

(54) PHASE CHANGE MEMORY STRUCTURE WITH EFFICIENT HEATING SYSTEM

(71) Applicant: INTERNATIONAL BUSINESS MACHINES CORPORATION, Armonk, NY (US)

(72) Inventors: Injo Ok, Loudonville, NY (US); Alexander Reznicek, Troy, NY (US); Choonghyun Lee, Rensselaer, NY (US); Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 141 days.

(21) Appl. No.: 16/293,167

(22) Filed: Mar. 5, 2019

(65) Prior Publication Data
US 2020/0287134 A1 Sep. 10, 2020

(51) Int. Cl.
*H01L 45/00* (2006.01)
*G11C 13/00* (2006.01)

(52) U.S. Cl.
CPC ........ *H01L 45/141* (2013.01); *G11C 13/0004* (2013.01); *H01L 45/06* (2013.01); *H01L 45/128* (2013.01); *H01L 45/1608* (2013.01)

(58) Field of Classification Search
CPC ..... H01L 45/141; H01L 45/06; H01L 45/128; H01L 45/1608; G11C 13/0004
USPC .......................................................... 257/4
See application file for complete search history.

(56) References Cited

U.S. PATENT DOCUMENTS

| | | | | |
|---|---|---|---|---|
| 7,439,536 | B2* | 10/2008 | Pellizzer | G11C 13/0004 257/2 |
| 7,671,355 | B2* | 3/2010 | Kuo | H01L 45/1683 257/3 |
| 7,750,335 | B2 | 7/2010 | Clevenger et al. | |
| 7,906,368 | B2 | 3/2011 | Breitwisch et al. | |
| 7,935,567 | B2 | 5/2011 | Sabdoval | |
| 8,426,967 | B2 | 4/2013 | Joseph et al. | |
| 8,493,772 | B2* | 7/2013 | Liu | H01L 45/126 365/148 |
| 8,633,464 | B2 | 1/2014 | Breitwisch et al. | |
| 9,246,093 | B2 | 1/2016 | Zanderighi et al. | |
| 2005/0136684 | A1 | 6/2005 | Mukai et al. | |
| 2007/0076486 | A1* | 4/2007 | Jeong | H01L 45/1233 365/185.22 |
| 2011/0155993 | A1* | 6/2011 | Chen | H01L 45/144 257/4 |
| 2015/0188050 | A1* | 7/2015 | Kim | H01L 27/2427 438/382 |

* cited by examiner

*Primary Examiner* — Ori Nadav
(74) *Attorney, Agent, or Firm* — Tutunjian & Bitetto, P.C.; Randy Emilio Tejeda

(57) ABSTRACT

A semiconductor device and method of forming a semiconductor device are provided. The semiconductor device includes a pore-type heater having a center pore recess. The semiconductor device further includes a tapered structure formed on the pore-type heater and having a tip portion at least extending down to the center pore recess. The semiconductor device also includes a containment layer confining volatile active material during any of a fabrication and an operation of the semiconductor device performed above a threshold temperature.

12 Claims, 19 Drawing Sheets

PHASE CHANGE MEMORY STRUCTURE WITH EFFICIENT HEATING SYSTEM

BACKGROUND

The present invention generally relates to memory devices, and more particularly to a Phase Change Memory (PCM) structure with an efficient heating system.

Electronic devices such as PCMs have volatile active materials that are susceptible to evaporation during processing or operation at elevated temperatures. Hence, there is a need for an improved approach for forming PCMs that prevents the evaporation of active materials of the PCMs during fabrication or operation.

SUMMARY

According to an aspect of the present invention, a semiconductor device is provided. The semiconductor device includes a pore-type heater having a center pore recess. The semiconductor device further includes a tapered structure formed on the pore-type heater and having a tip portion at least extending down to the center pore recess. The semiconductor device also includes a containment layer confining volatile active material during any of a fabrication and an operation of the semiconductor device performed above a threshold temperature.

According to another aspect of the present invention, a method is provided for forming a semiconductor device. The method includes forming a pore-type heater having a center pore recess. The method further includes forming a tapered structure on the pore-type heater, the tapered structure formed to have a tip portion at least extending down to the center pore recess. The method also includes forming a containment layer confining volatile active material during any of a fabrication and an operation of the semiconductor device performed above a threshold temperature.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
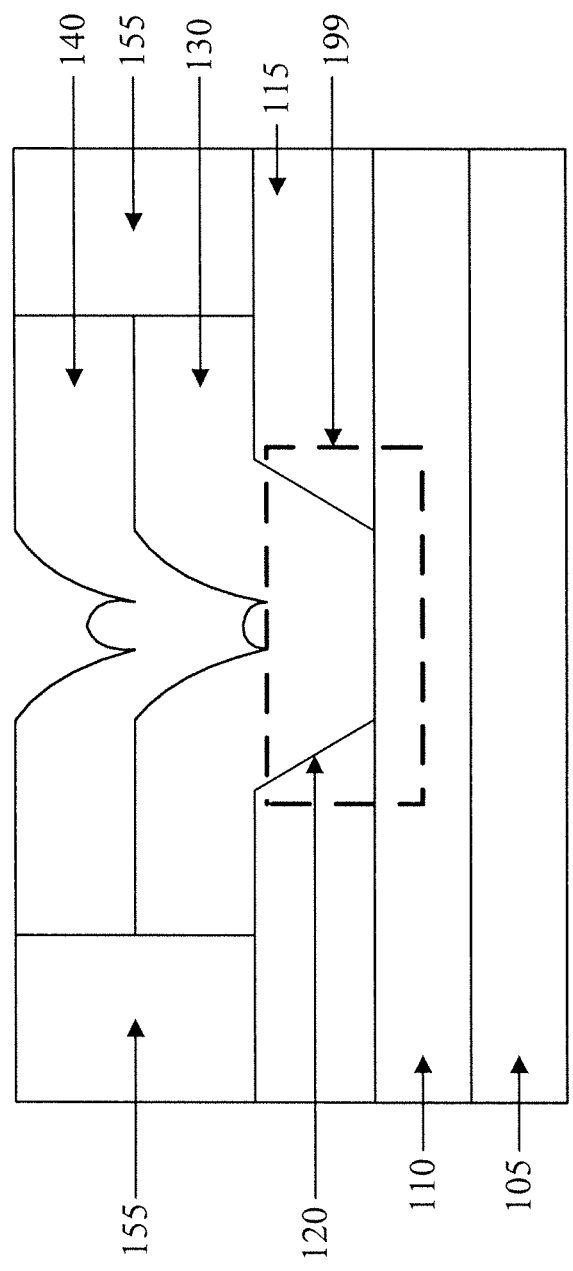
FIG. 1 is a diagram showing an exemplary semiconductor device to which the present invention can be applied, in accordance with an embodiment of the present invention.

The present invention is directed to a Phase Change Memory (PCM) structure with an efficient heating system.

In an embodiment, the present invention is directed to electronic devices such as PCMs that have volatile active materials susceptible to evaporation during fabrication or operation at elevated temperatures. In an embodiment, the present invention provides a method of making electronic devices such as PCMs, where such method includes protective steps designed to prevent the evaporation of active materials during fabrication or operation. In an embodiment, the present invention provides a method of making a Chalcogenide or phase-change memory or switching device that include low temperature deposition of a containment layer to confine a volatile active material during subsequent high temperature fabrication or operation. Exemplary switching devices can include, but are not limited to, for example, nonvolatile semiconductor memories, neuromorphic computing devices, and so forth.

In an embodiment, the present invention provides a method and a structure which are each directed to a phase change cell with minimum bottom contact. In an embodiment, a new process scheme is provided that, in turn, provides an improved thermal heating system that can operate at lower temperatures relative to conventional PCMs.

Hence, in an embodiment, a method and structure are provided for forming multiple phase change heaters which make PCM set and programming with a lower power use.

Moreover, in an embodiment, a PCM is provided with a narrow bottom contact and a narrow bottom PCM shape.

Hence, in an embodiment, a center metal (heater) pore recess is formed around a metal of high resistive TaN. A tapered V-shape GST is proposed on top of the pore heater. In an embodiment, a V-shape formation is formed in dielectric and filled with GST. As used herein, the term "heater" refers to a structure used to generate heat in order to cause a change of state or phrase in a material used in a phase change memory device. As used herein, the term "pore-type heater" refers to a heater that includes a center pore recess.

A structure formed in accordance with the present invention provides better thermal heating that can operate at lower temperatures relative to conventional structures. In order to minimize the energy required to program the device, it is desirable to minimize the area of contact. Moreover, the formation of multiple phase change heaters makes PCM set and programming use less power relative to conventional structures. Thus, three different metal areas are formed, e.g., using TiN and TaN. Since TiN resistance is much less than TaN, the current can only (or primarily) flow through the narrow TiN. This thin TiN make more efficient heating.

Chalcogenide materials are an emerging class of commercial electronic materials that exhibit switching, memory, logic, and processing functionality. One type of chalcogenide memory device utilizes the wide range of resistance values available for the active chalcogenide material as the basis of memory operation. Each resistance value corresponds to a distinct structural state of the chalcogenide material and one or more of the states can be selected and used to define operational memory states. Chalcogenide materials exhibit a crystalline state or phase as well as an amorphous state or phase. Different structural states of a chalcogenide material differ with respect to the relative proportions of crystalline and amorphous phase in a given volume or region of chalcogenide material. The range of resistance values is bounded by a set state and a reset state of the chalcogenide material. The set state is a low resistance structural state whose electrical properties are primarily controlled by the crystalline portion of the chalcogenide material and the reset state is a high resistance structural state whose electrical properties are primarily controlled by the amorphous portion of the chalcogenide material. While one or more embodiments of the present invention are described with respect to Chalcogenide, other materials able to selectively exhibit a crystalline state or phase and an amorphous state or phase can be used, while maintaining the spirit of the present invention.

Figure 2:
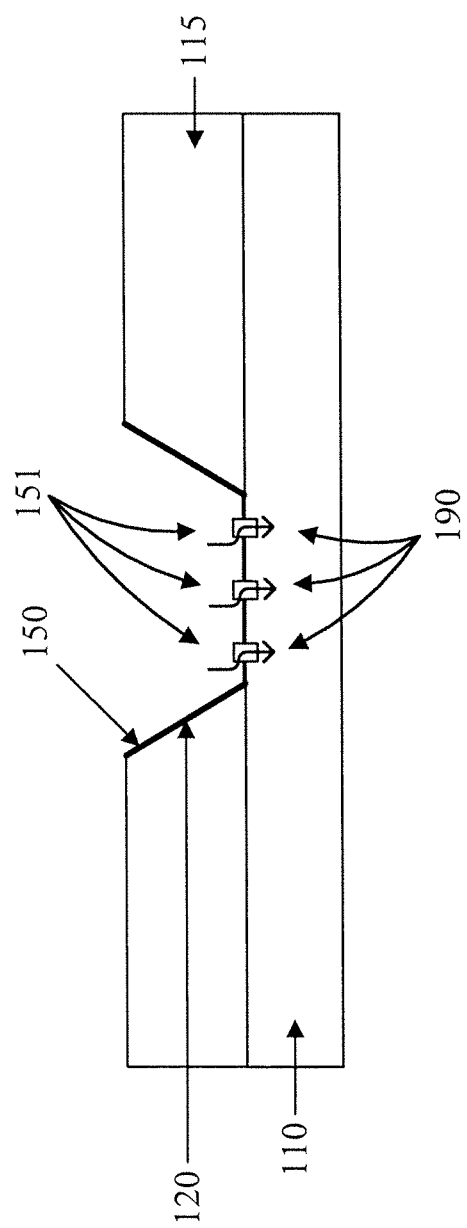
FIG. 2 is a diagram further showing various aspects of the semiconductor device of FIG. 1, in accordance with an embodiment of the present invention.

FIG. 1 is a diagram showing an exemplary semiconductor device 100 to which the present invention can be applied, in accordance with an embodiment of the present invention. FIG. 2 is a diagram further showing various aspects of the semiconductor device 100 of FIG. 1 relating to block 199, in accordance with an embodiment of the present invention.

As is known in the art, a breakdown layer 150 is a thin insulating layer used to reduce the effective area of contact between lower electrode 110 and active material 130. During conditioning of the device 100, an electrical signal 190 punctures the breakdown layer 150 to create an opening 151 that is essentially a localized, small area conductive pathway (and hence, also represented by the figure reference numeral 151) from the lower electrode 110 to active material 130. The rest of the breakdown layer 150 remains intact and provides a resistive barrier that channels the flow of electrical current from the lower electrode 110 to the conductive punctured region.

Figure 3:
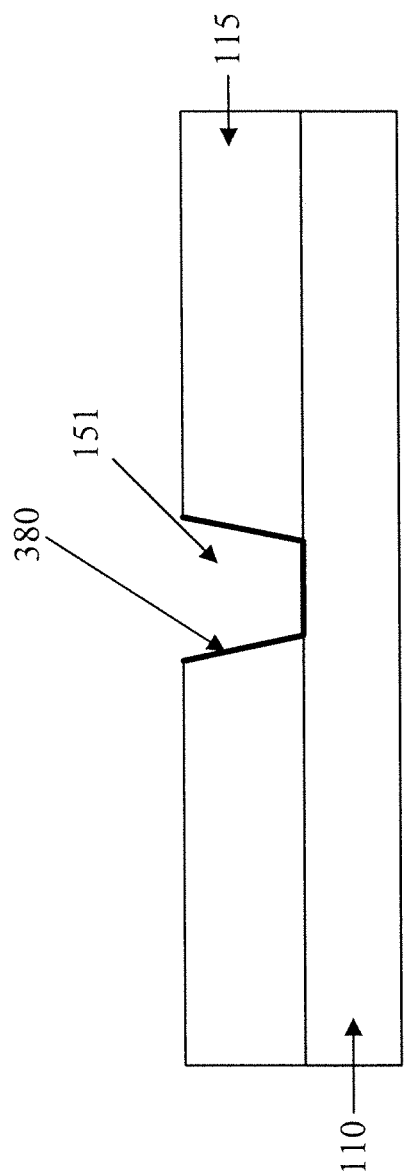
FIG. 3 is a diagram further showing various aspects of the semiconductor device of FIG. 1 used in junction with a sidewall spacer, in accordance with an embodiment of the present invention.

The opening 151 establishes an area of contact between the lower electrode 110 and active material 130. In order to minimize the energy required to program the device 100, it is desirable to minimize the area of contact. The opening 151 may be formed using standard lithographic techniques (e.g. masking and etching) to achieve lithographic dimensions. The opening 151 may be shaped as a hole, trench, or depression. Optionally, as is known in the art, sub lithographic dimensions may be achieved by including a sidewall spacer within the opening 151. FIG. 3 is a diagram further showing various aspects of the semiconductor device 100 of FIG. 1 used in junction with a sidewall spacer 380, in accordance with an embodiment of the present invention. Semiconductor device 100 further includes elements 105, 115, 120, 140, and 155.

Figure 4:
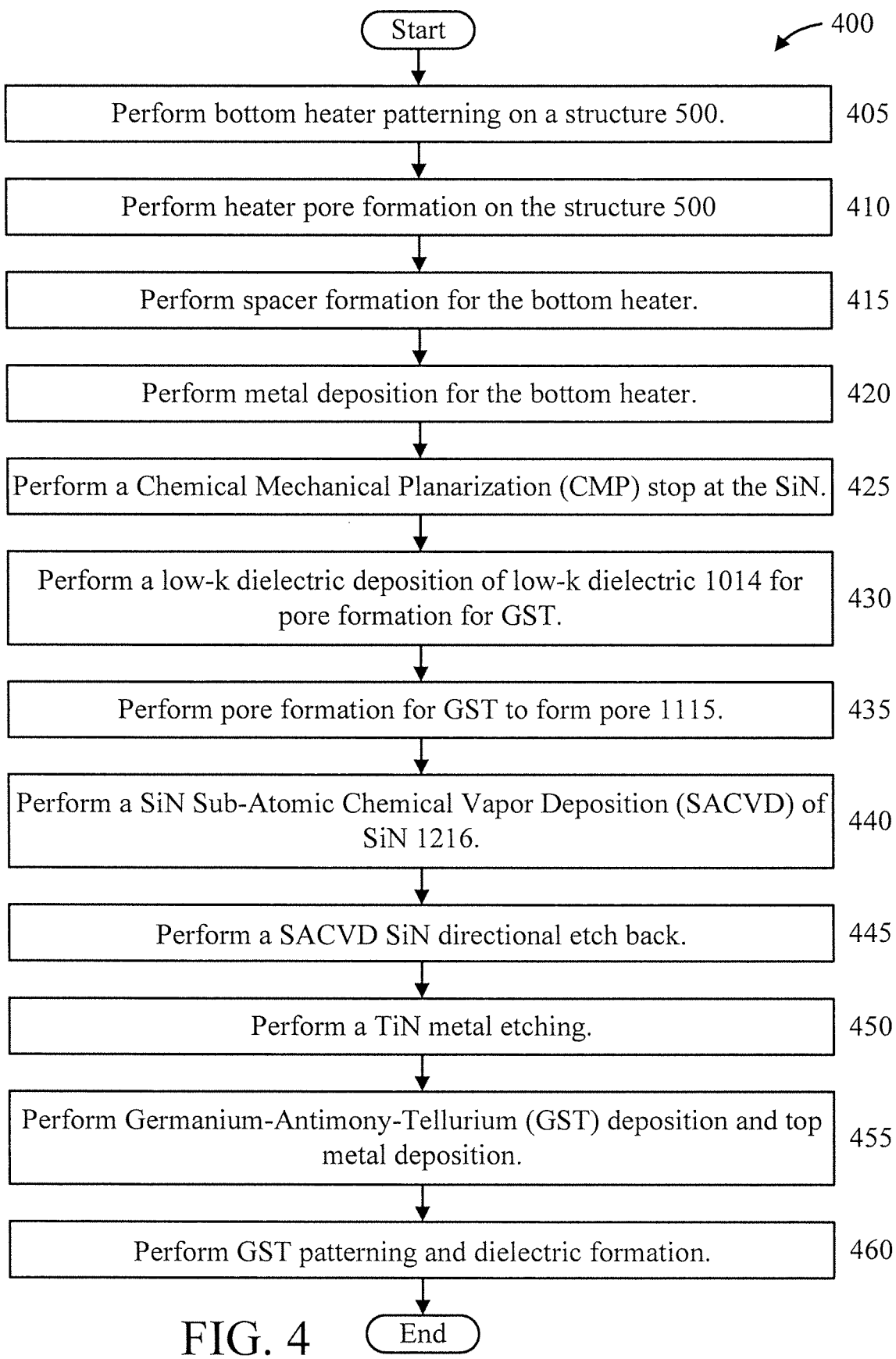
FIG. 4 is a flow diagram showing an exemplary method for forming a PCM, in accordance with an embodiment of the present invention.
Figure 5:
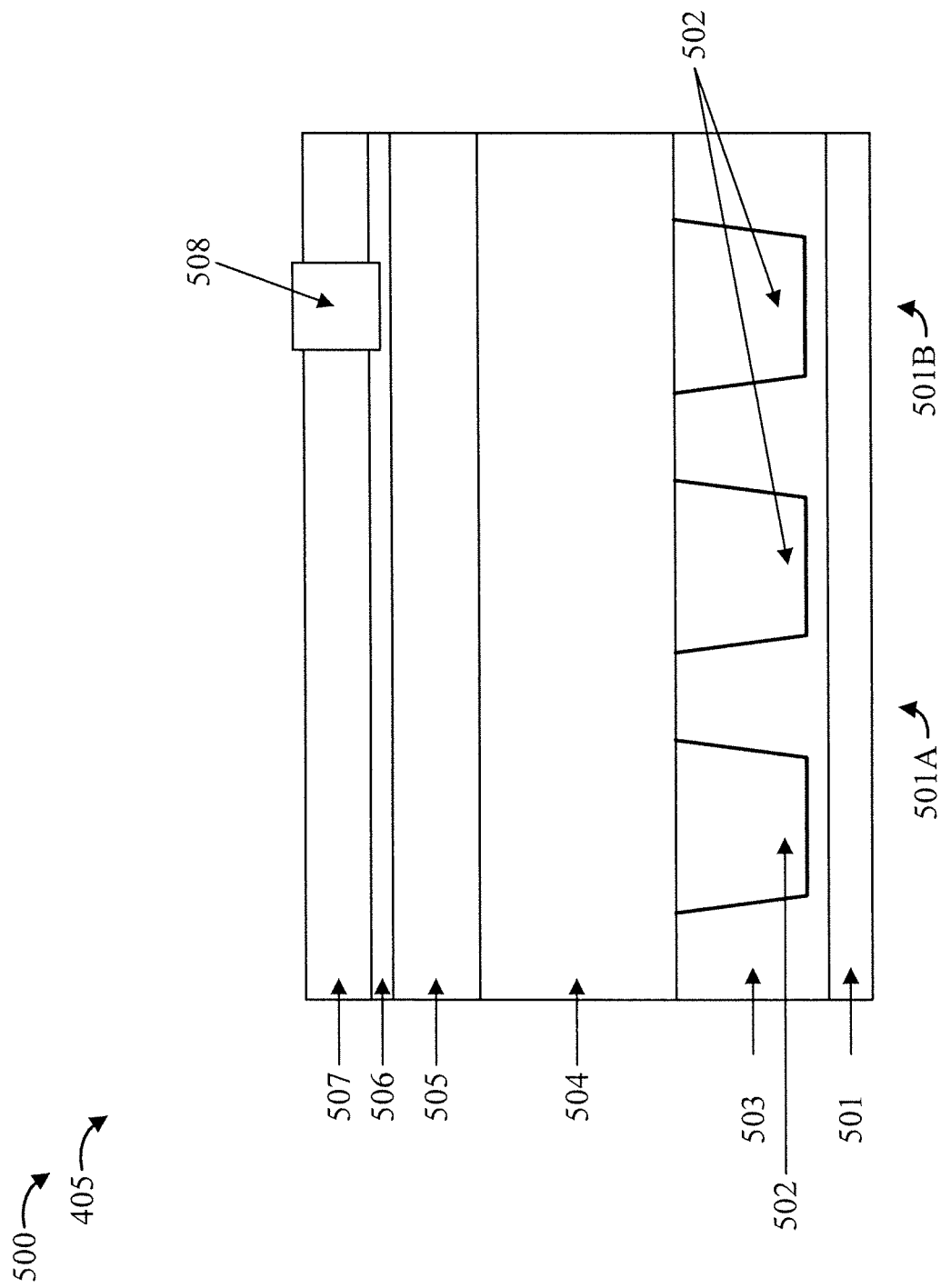
FIG. 5 is a diagram graphically showing an exemplary result of block 405 of the method of FIG. 4, in accordance with an embodiment of the present invention.
Figure 6:
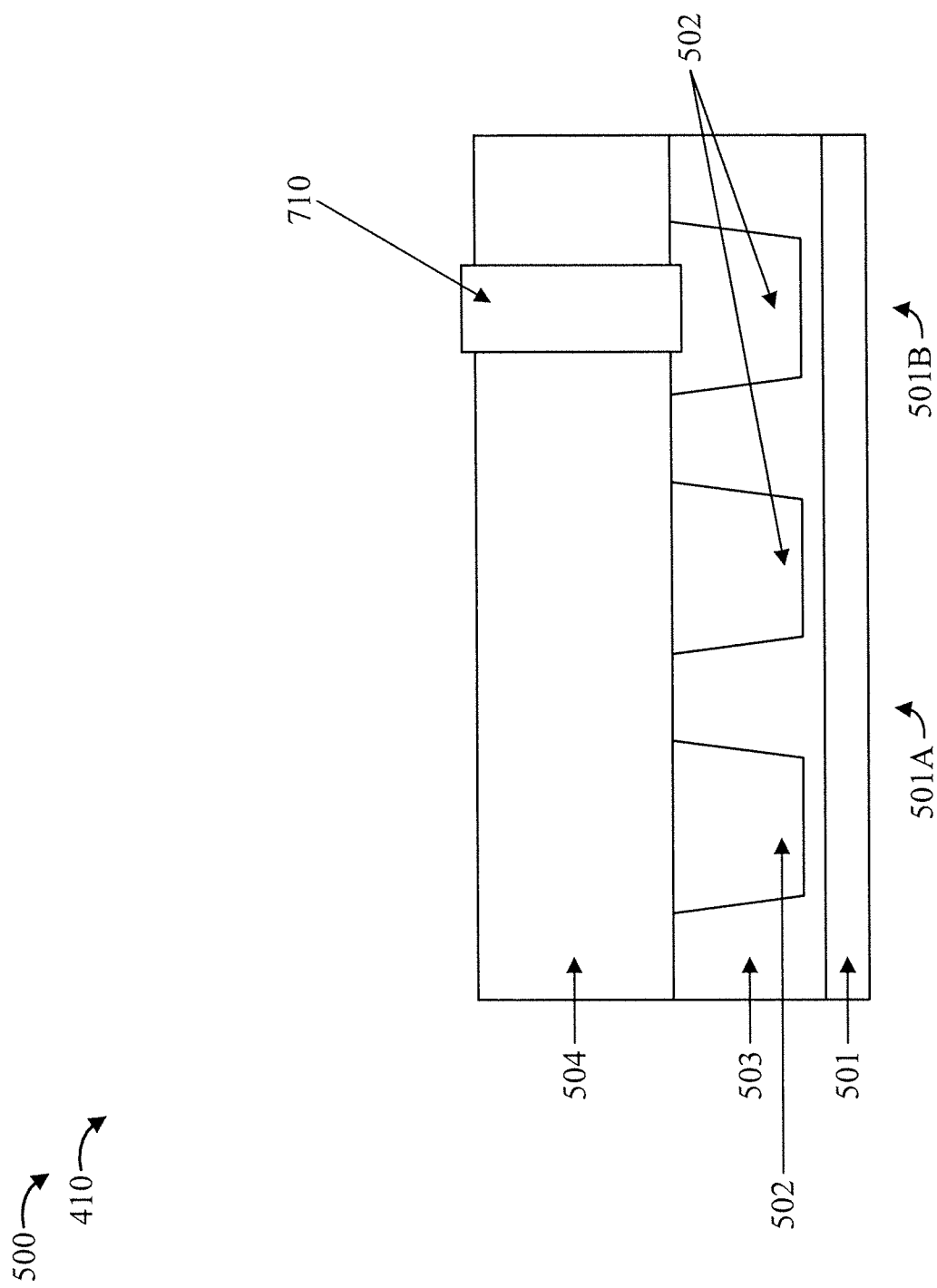
FIG. 6 is a diagram graphically showing an exemplary result of block 410 of the method of FIG. 4, in accordance with an embodiment of the present invention.
Figure 7:
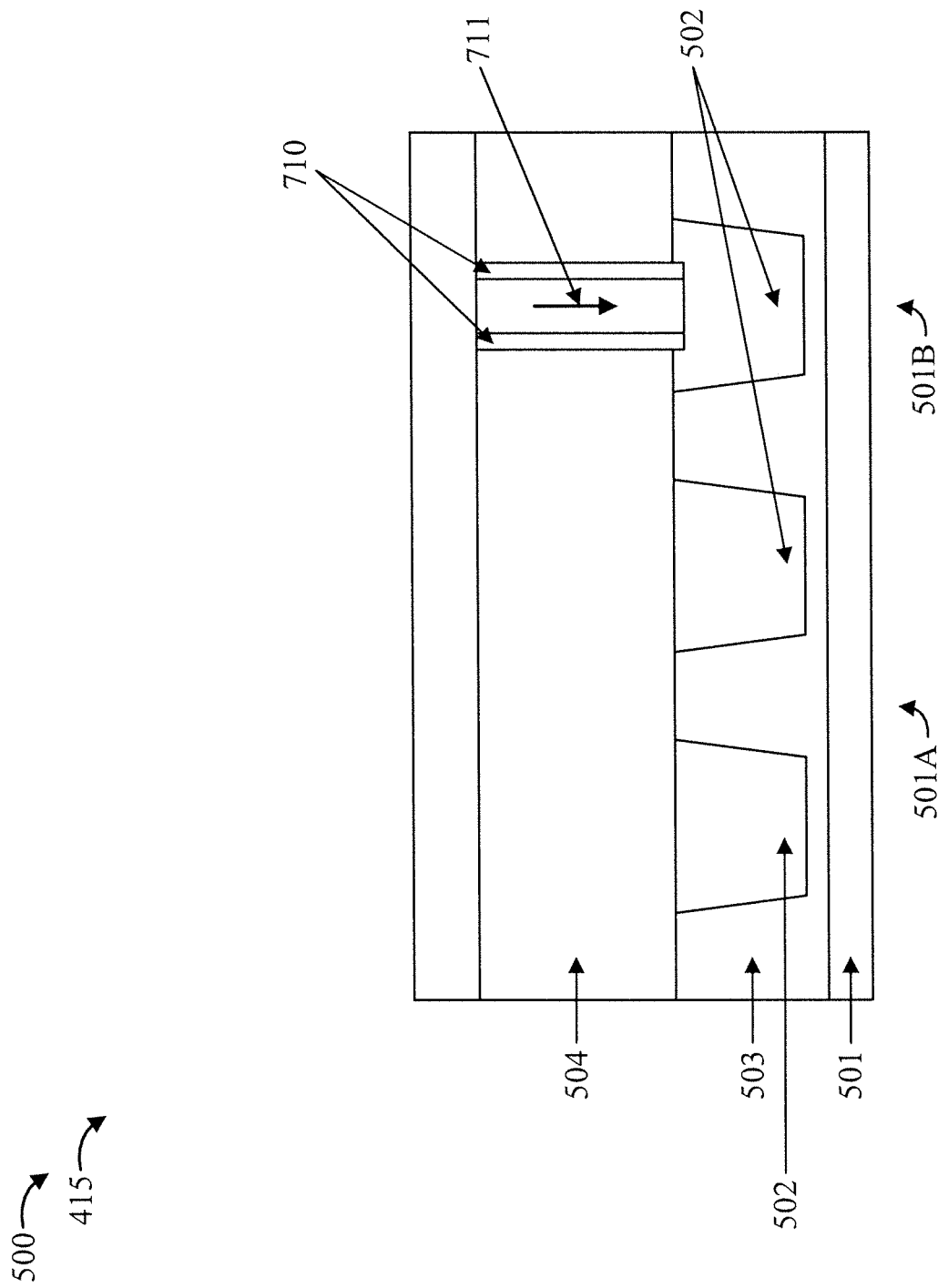
FIG. 7 is a diagram graphically showing an exemplary result of block 415 of the method of FIG. 4, in accordance with an embodiment of the present invention.
Figure 8:
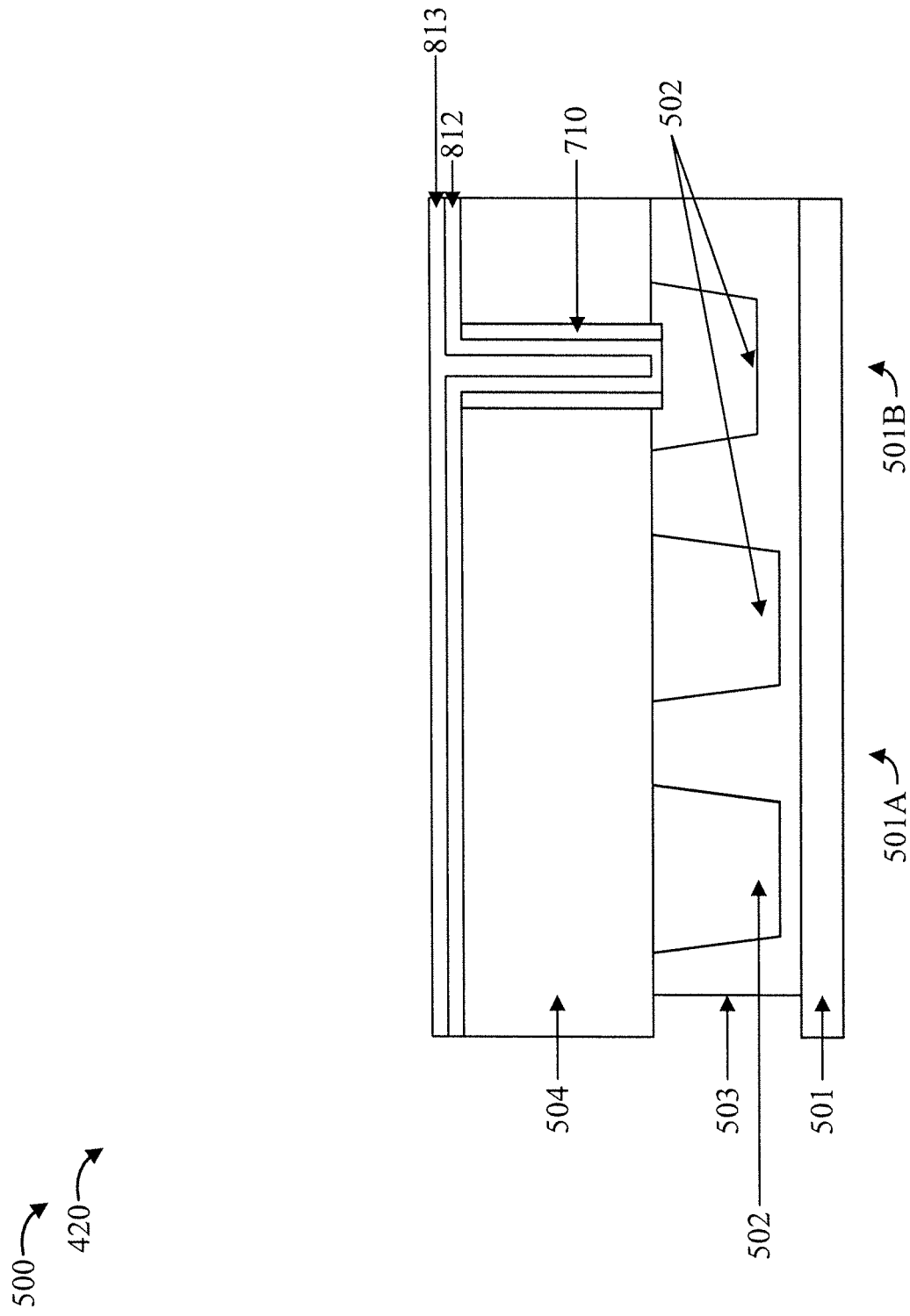
FIG. 8 is a diagram graphically showing an exemplary result of block 420 of the method of FIG. 4, in accordance with an embodiment of the present invention.
Figure 9:
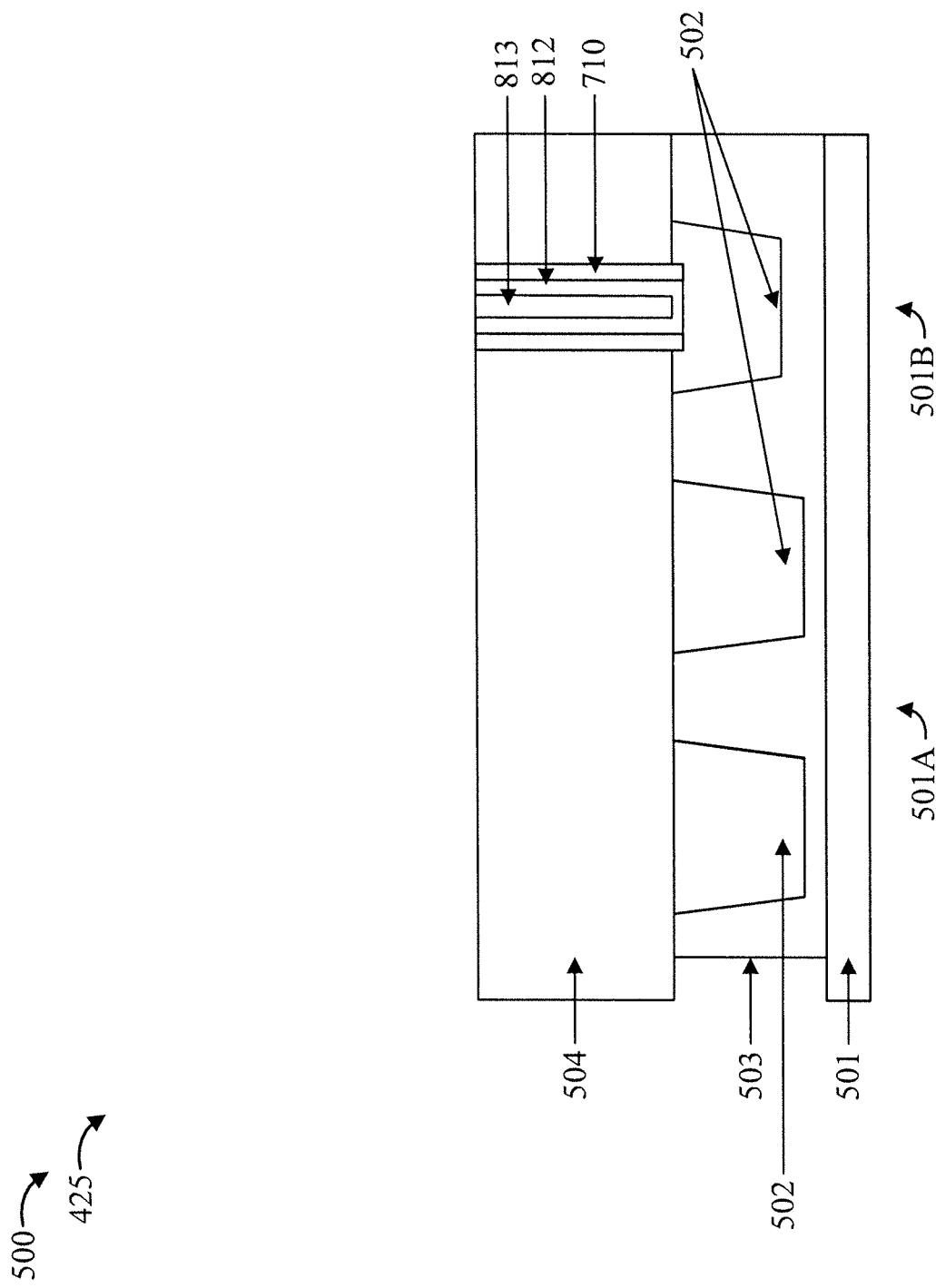
FIG. 9 is a diagram graphically showing an exemplary result of block 425 of the method of FIG. 4, in accordance with an embodiment of the present invention.
Figure 10:
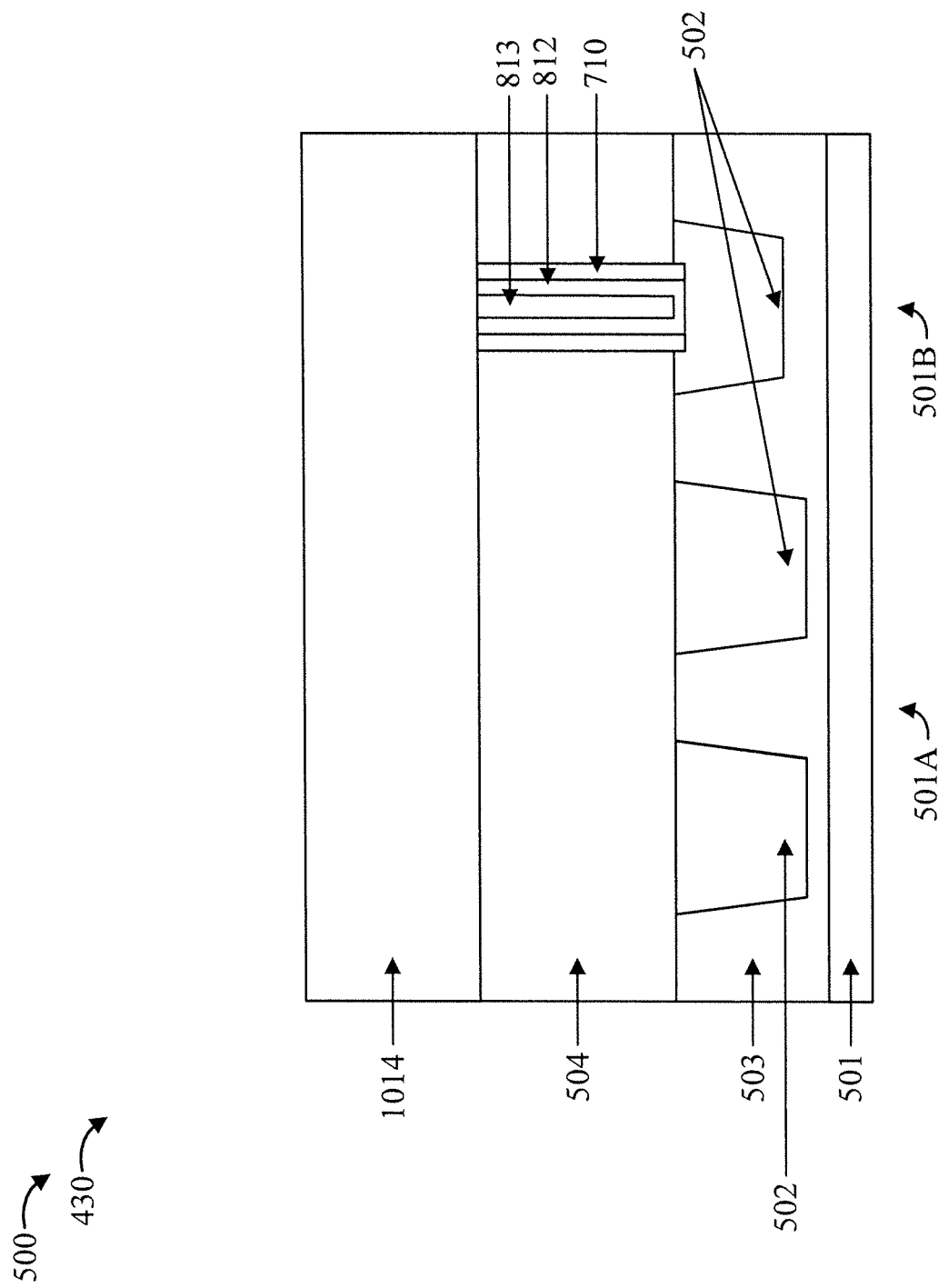
FIG. 10 is a diagram graphically showing an exemplary result of block 430 of the method of FIG. 4, in accordance with an embodiment of the present invention.

FIG. 4 is a flow diagram showing an exemplary method 400 for forming a PCM, in accordance with an embodiment of the present invention.

FIGS. 5 through 10 show various constituent blocks of method 400 in graphical form, in accordance with one or more embodiments of the present invention.

At block 405, perform bottom heater patterning on a structure 500. In an embodiment, the structure 500 has an active region area 501 having a Power On Reset (POR) area 501A, a PCM area 501B, a bottom metal layer 502 interdispersed within a dielectric layer 503, an insulating layer 504 (e.g., formed from NBLoK® or Silicon Mononitride (SiN) or so forth), a (100 nm thick) Organic Planarized Layer (OPL) 505, a Silicon containing Anti-Reflective Coating (SiARC) layer 506, a Photo-Resist (PR) layer 507, and a trench (aka pore) 508. NBLoK® is a nitrogen-doped Silicon carbide. An exemplary result of block 405 is graphically shown in FIG. 5.

At block 410, perform heater pore formation on the structure 500 by removing (e.g., etching) the OPL 505, the SiARC layer 506, the Photo-Resist (PR) layer 507, and the trench 508, and by forming a trench (aka pore) 609 through the insulating layer 504 up to and partially in the bottom metal layer 502. An exemplary result of block 410 is graphically shown in FIG. 6.

At block 415, perform spacer formation for the bottom heater. In an embodiment, block 415 involves Silicon mononitride (SiN) deposition 710 and directional etching 711 in order to make the side spacer(s). An exemplary result of block 415 is graphically shown in FIG. 7.

At block 420, perform metal deposition for the bottom heater. In an embodiment, block 420 involves target bottom metal deposition that, in turn, involves Tantalum Nitride (TaN) and/or Titanium Nitride (TiN). In an embodiment, a TaN layer 812 having a thickness of less than 5 nm and a TiN layer 813 having a thickness of less than 7 nm, are deposited. An exemplary result of block 420 is graphically shown in FIG. 8.

At block 425, perform a Chemical Mechanical Planarization (CMP) stop at the SiN. An exemplary result of block 425 is graphically shown in FIG. 9.

At block 430, perform a low-k dielectric deposition of a low-k dielectric 1014 for pore formation for GST. An exemplary result of block 430 is graphically shown in FIG. 10.

Figure 11:
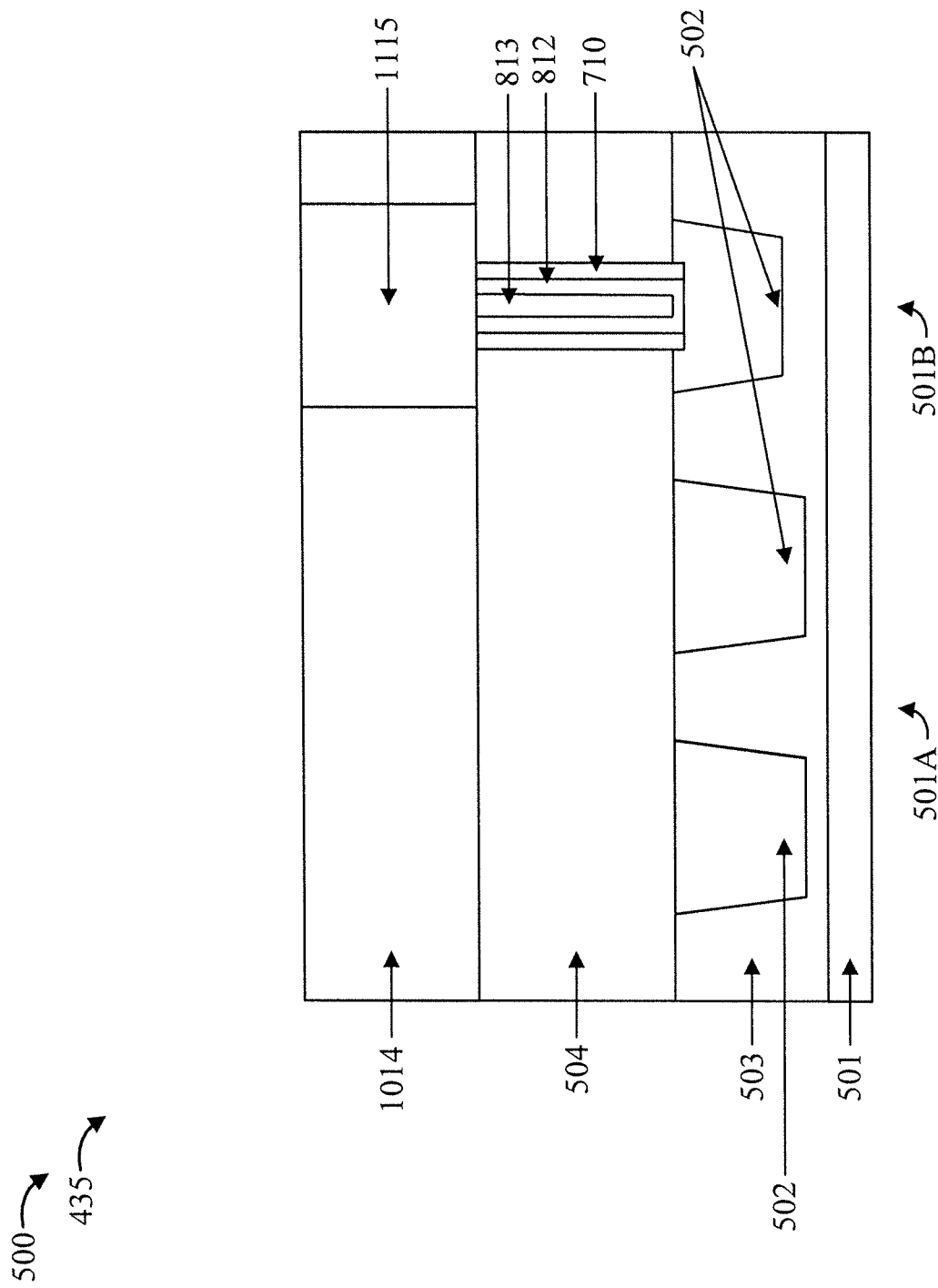
FIG. 11 is a diagram graphically showing an exemplary result of block 435 of the method of FIG. 4, in accordance with an embodiment of the present invention.

At block 435, perform pore formation for GST to form pore 1115. An exemplary result of block 435 is graphically shown in FIG. 11.

Figure 12:
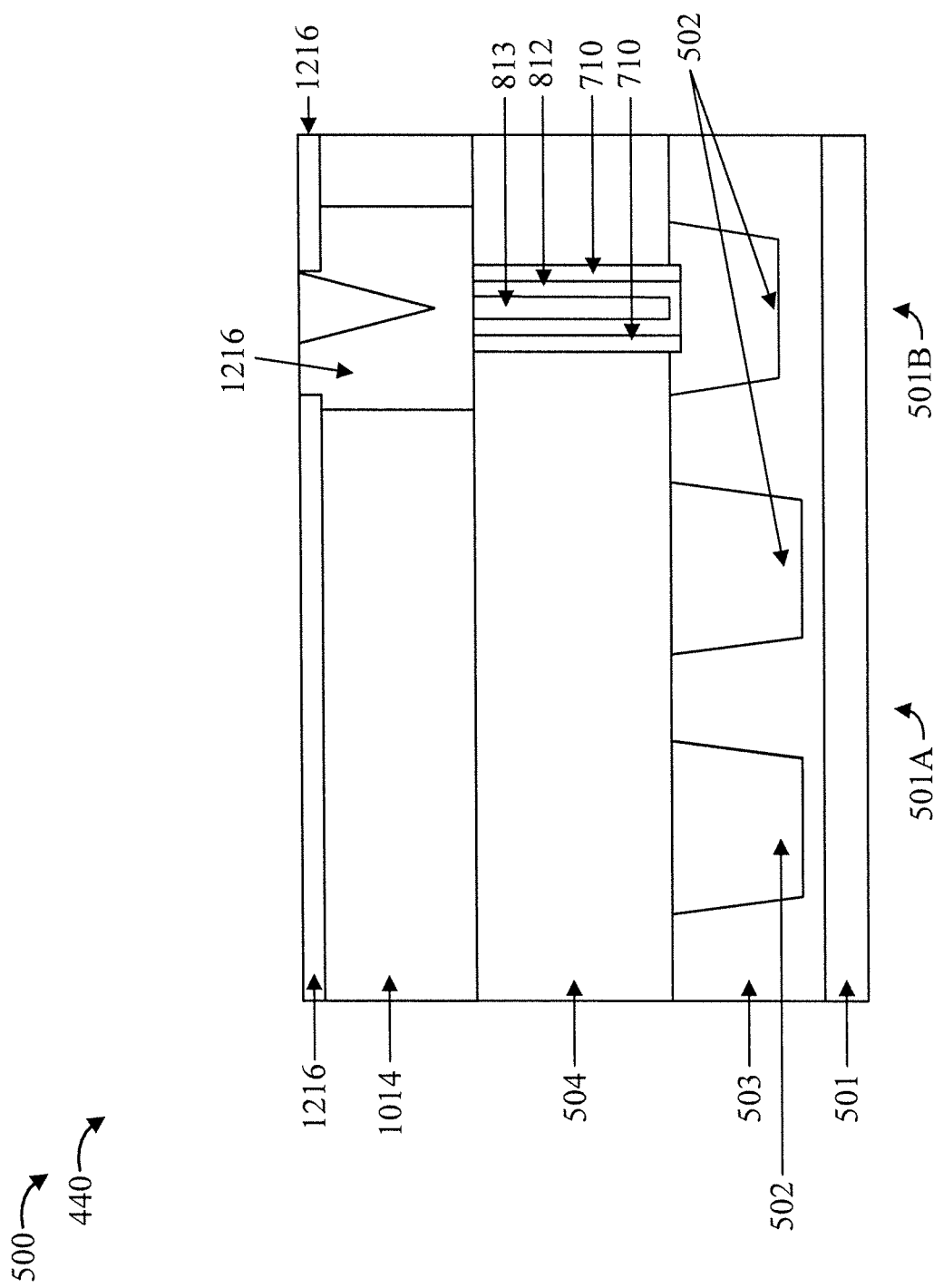
FIG. 12 is a diagram graphically showing an exemplary result of block 440 of the method of FIG. 4, in accordance with an embodiment of the present invention.

At block 440, perform a SiN Sub-Atomic Chemical Vapor Deposition (SACVD) of SiN 1216. An exemplary result of block 440 is graphically shown in FIG. 12.

Figure 13:
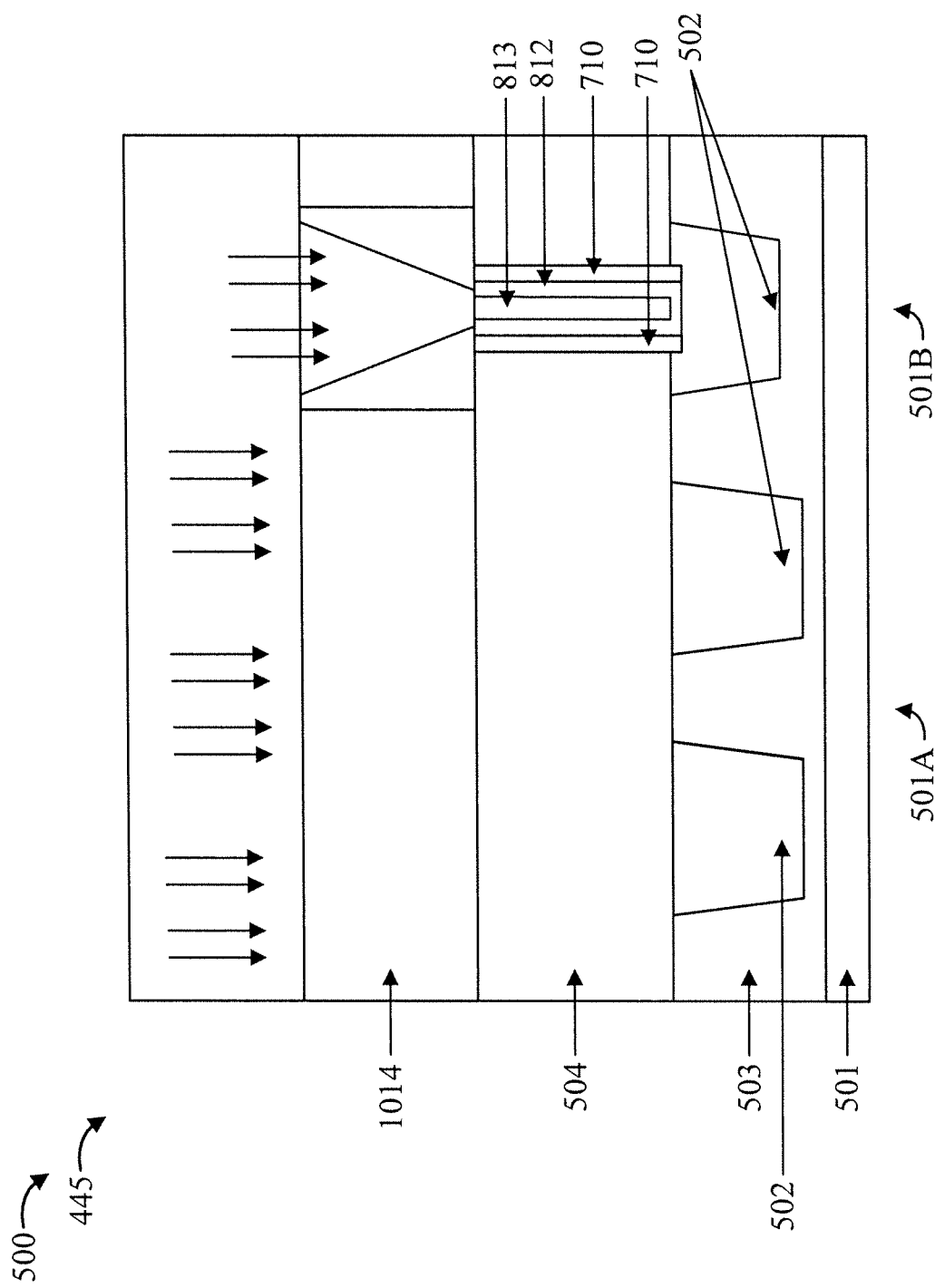
FIG. 13 is a diagram graphically showing an exemplary result of block 445 of the method of FIG. 4, in accordance with an embodiment of the present invention.

At block 445, perform a SACVD SiN directional etch back. An exemplary result of block 445 is graphically shown in FIG. 13.

Figure 14:
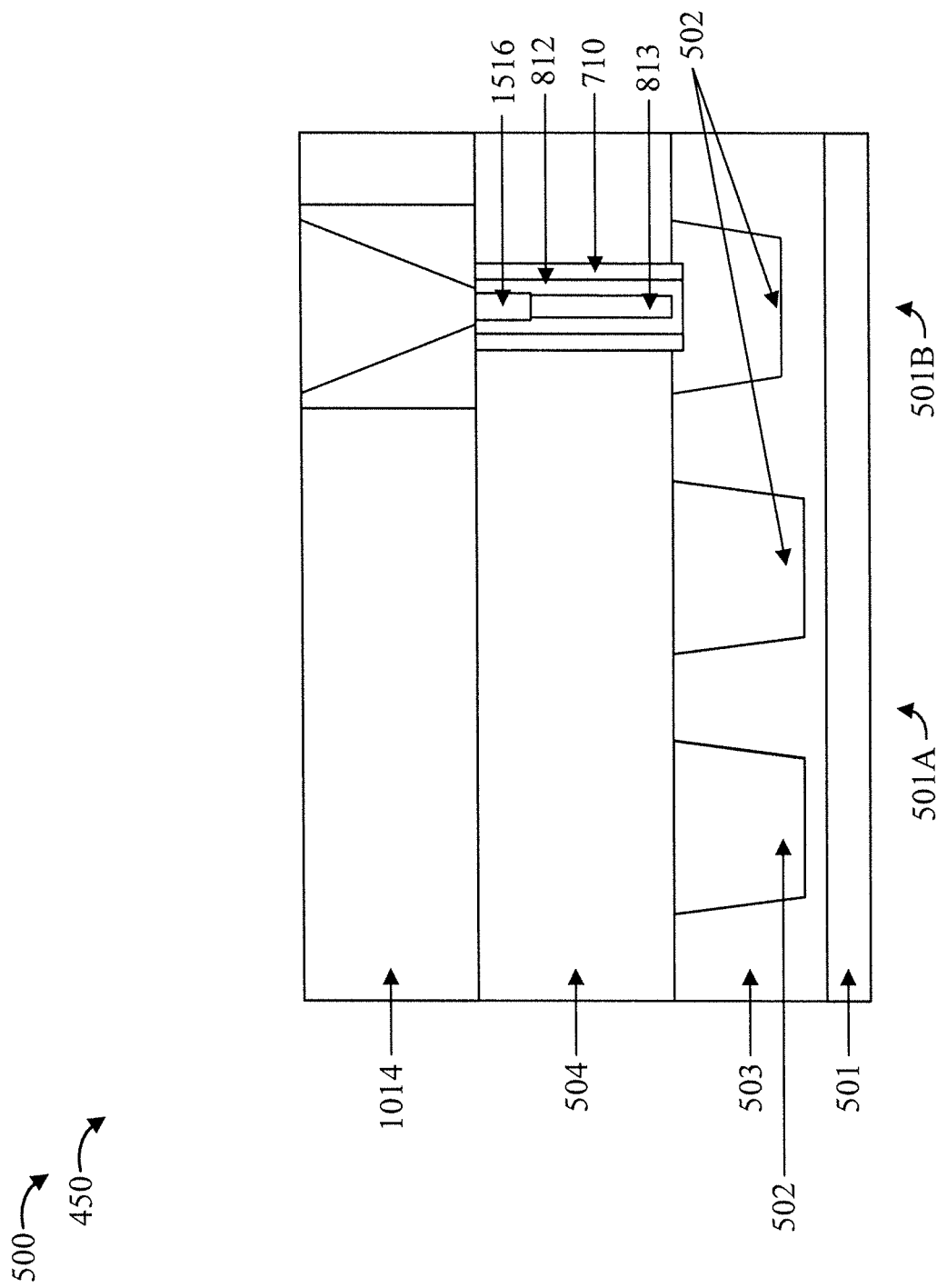
FIG. 14 is a diagram graphically showing an application of block 450 of the method of FIG. 4, in accordance with an embodiment of the present invention.
Figure 15:
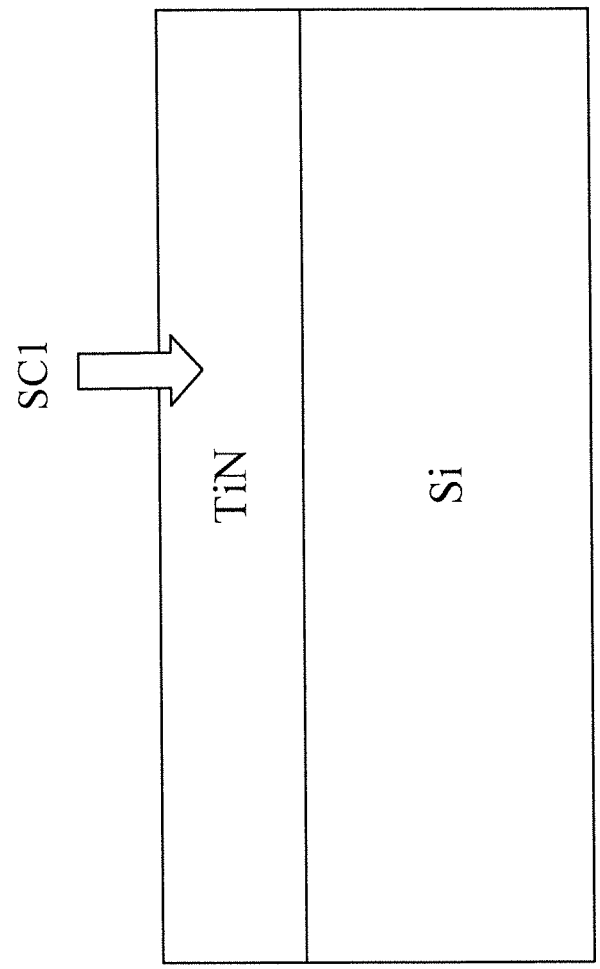
FIG. 15 is a diagram graphically showing an exemplary result of block 450 of the method of FIG. 4, in accordance with an embodiment of the present invention.
Figure 16:
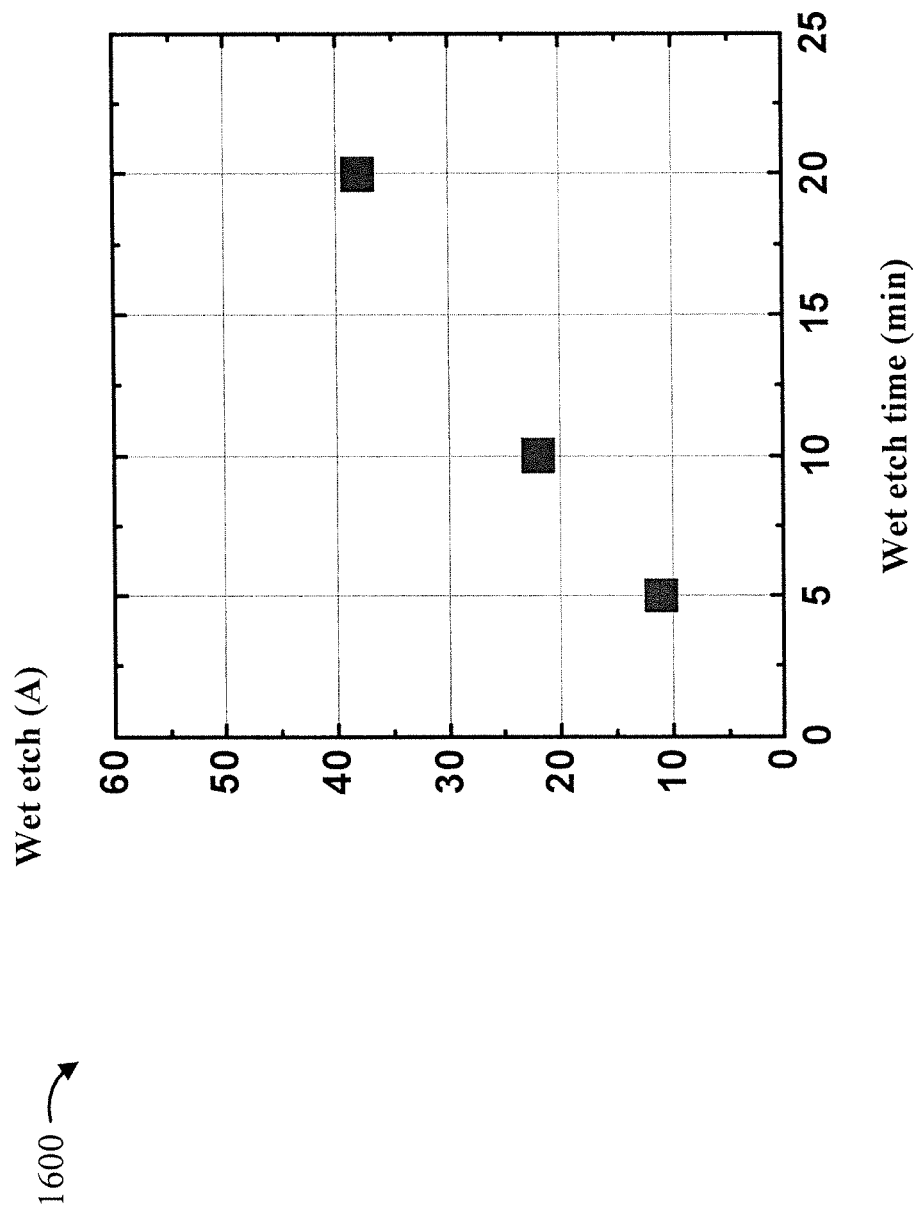
FIG. 16 is a diagram graphically showing an exemplary plot of wet etch rates for TiN and TiAlC for block 450 of the method of FIG. 4, in accordance with an embodiment of the present invention.

At block 450, perform a TiN metal etching (resulting in an etched back region 1516). In an embodiment, block 450 can involve, for example, TiN selective etching by SC1 wet as shown with respect to FIGS. 14-16. An exemplary application 1400 of block 450 is graphically shown in FIG. 14. An exemplary result of block 450 is graphically shown in FIG. 15. An exemplary plot 1600 of the wet etch rates for TiN and TiAlC is graphically shown in FIG. 16.

Figure 17:
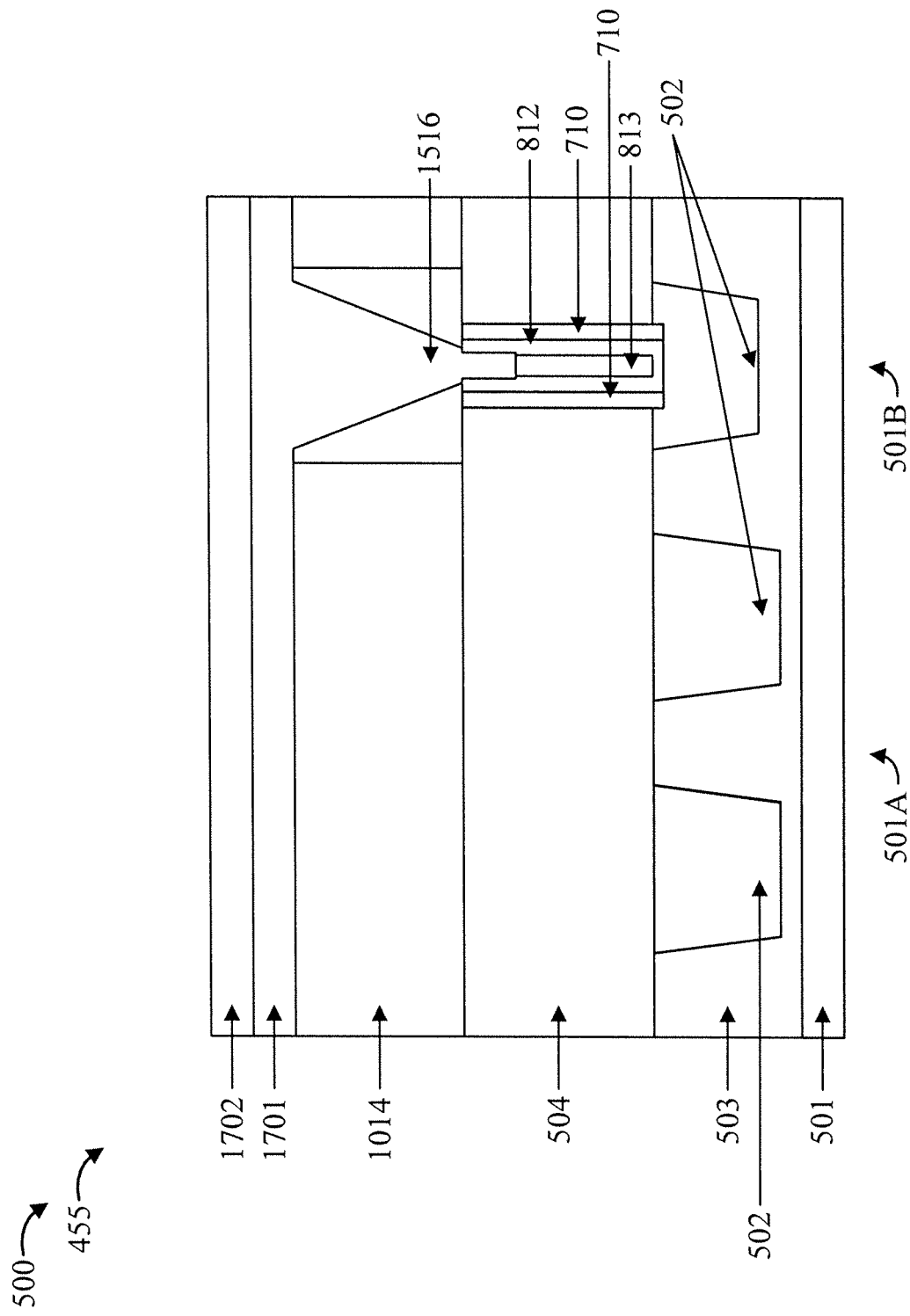
FIG. 17 is a diagram graphically showing an exemplary result of block 455 of the method of FIG. 4, in accordance with an embodiment of the present invention.

At block 455, perform Germanium-Antimony-Tellurium (GST) deposition of GST 1701 and top metal deposition of top metal 1702. An exemplary result of block 455 is graphically shown in FIG. 17.

Figure 18:
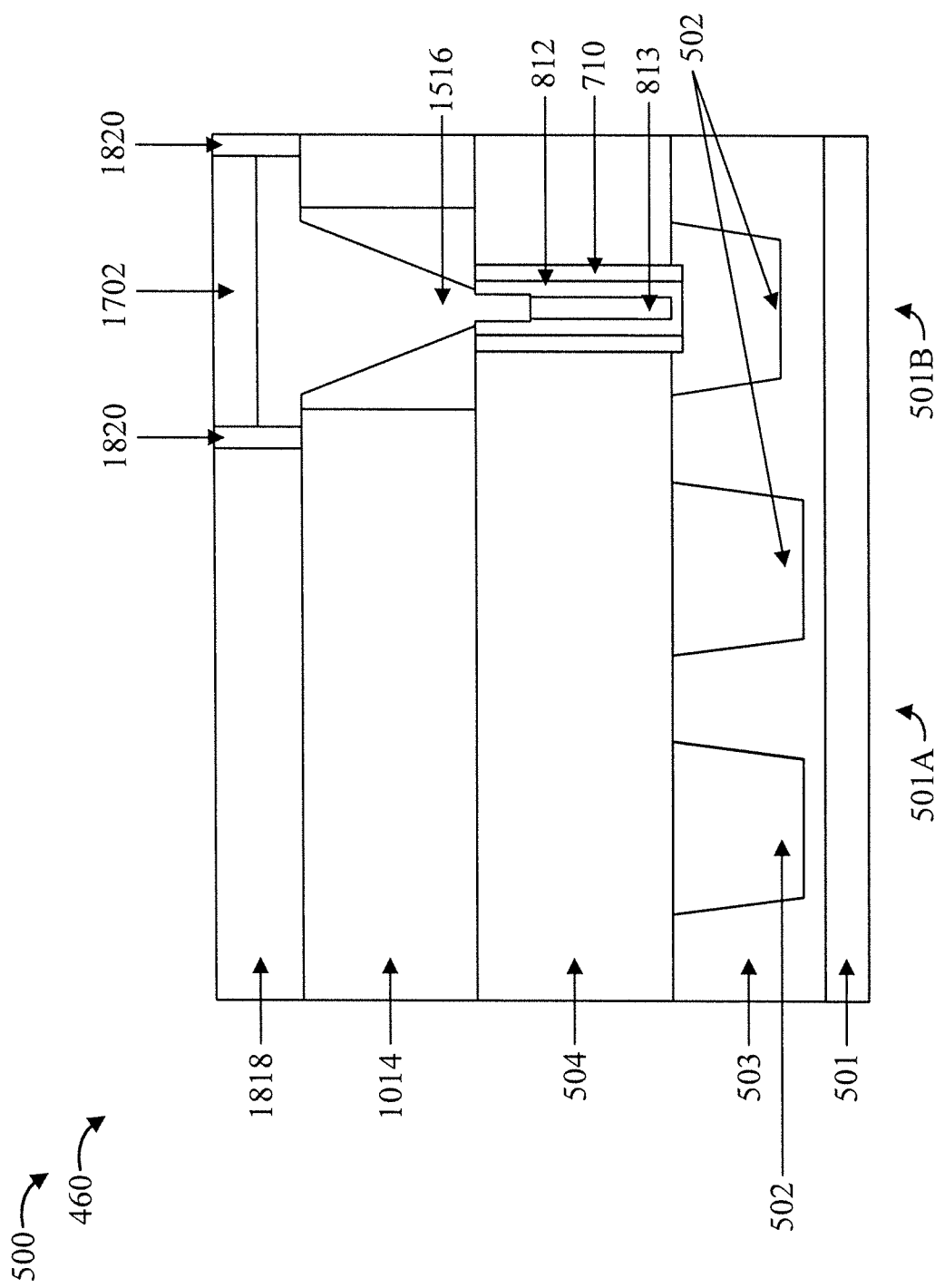
FIG. 18 is a diagram graphically showing an exemplary result of block 460 of the method of FIG. 4, in accordance with an embodiment of the present invention.

At block 460, perform GST patterning and dielectric formation to form a SiN or GST encapsulation layer 1820. In an embodiment, the dielectric formation can involve, for example, depositing a low-k dielectric or SiN (collectively denoted by the figure reference numeral 1818). An exemplary result of block 455 is graphically shown in FIG. 18. In an embodiment, a semiconductor device 500 is formed to include the following: a pore-type heater 813 having a center pore recess (lower portion of 1516); and a tapered structure (sidewalls of 1516) formed on the pore-type heater 813 and having a tip portion (bottom of 1516) at least extending down to the center pore recess (lower portion of 1516); wherein the pore-type heater 813 further has a dual walled containment layer 710, 812 confining volatile active material 813 by two encapsulating adjacent elements of the dual walled containment layer 710, 812 during any of a fabrication and an operation of the semiconductor device 500 performed above a threshold temperature, a first 812 of the two encapsulating adjacent elements fully encapsulating sides and a lower region of the volatile active material 813 and a second 710 of the two encapsulating adjacent elements fully encapsulating sides of the first 812 of the two encapsulating adjacent elements.

Figure 19:
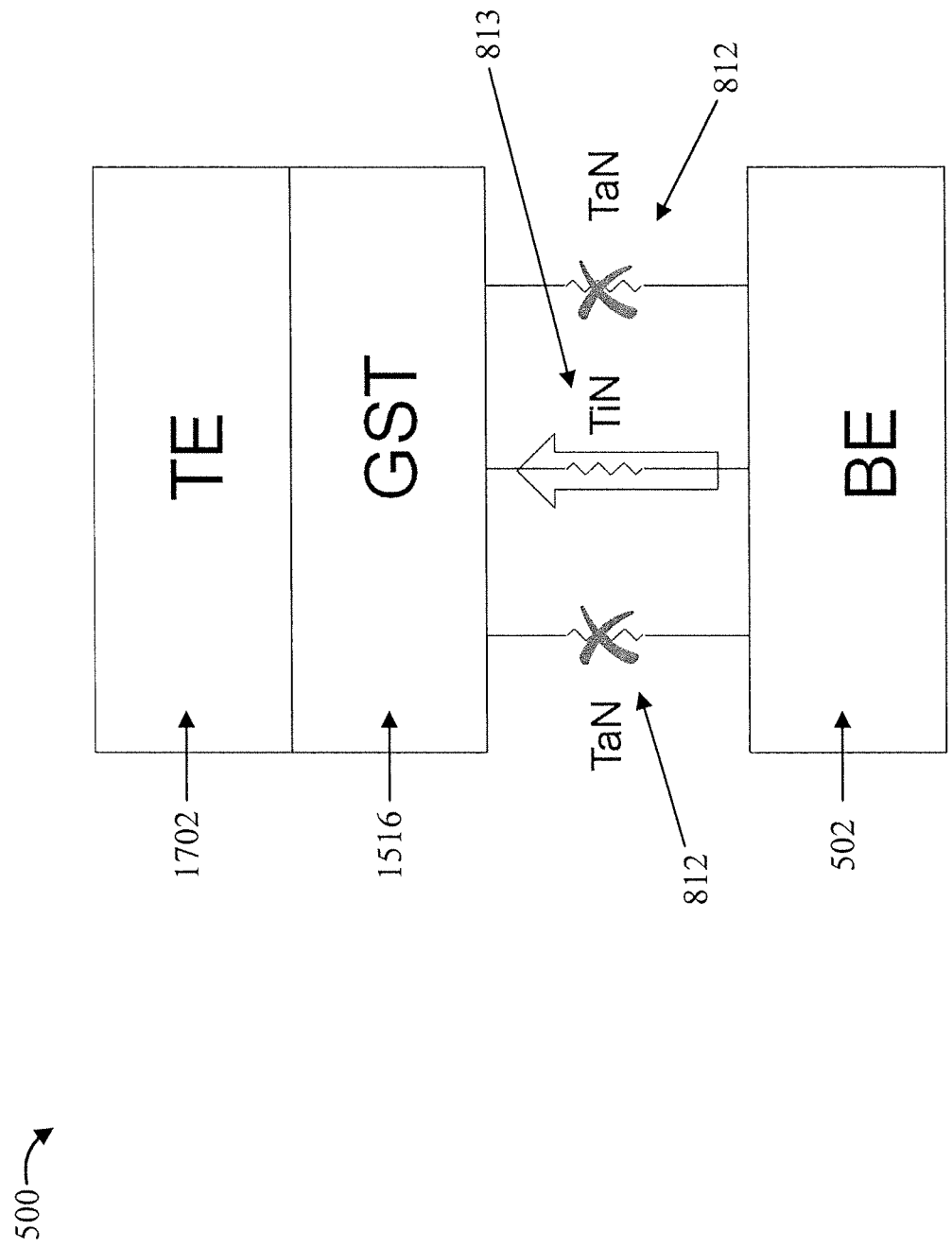
FIG. 19 is a diagram further showing a portion of structure 500, in accordance with an embodiment of the present invention.

FIG. 19 is a diagram further showing a portion of structure 500, in accordance with an embodiment of the present invention.

As shown, most of the current flow is confined in the TiN core because of the huge resistance gap between TaN and TiN (1000:1 ratio).

While TaN and TiN are used in one or more exemplary embodiments, it is to be appreciated that other metals and materials can be used, as long a resistance differential above a threshold amount (e.g., 1000) exists in order to primarily confine current to the core of the resultant sandwich structure of TaN/TiN/TaN. These and other variations of the present invention are readily determined by one of ordinary skill in the art, given the teachings of the present invention provided herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
    a pore-type heater having a center pore recess; and
    a tapered structure formed on the pore-type heater and having a tip portion at least extending down to the center pore recess;
    wherein the pore-type heater further has a per-single-heater-dedicated, non-tapered dual-walled-per-side containment layer confining volatile active material by two encapsulating adjacent non-tapered elements which are adjacent to each other, a first of the two encapsulating adjacent non-tapered elements fully encapsulating sides and a bottom region of the volatile active material and a second of the two encapsulating adjacent non-tapered elements fully encapsulating only sides of the first of the two encapsulating adjacent non-tapered elements without contacting an area of the first of the two encapsulating adjacent non-tapered materials under the bottom region and under the pore-type heater, and wherein the per-single-heater-dedicated, non-tapered dual-walled-per-side containment layer and the two encapsulating adjacent non-tapered elements are partially recessed within a metal layer inter-dispersed within a dielectric layer.

2. The semiconductor device of claim 1, wherein the pore-type heater is filled with at least two metals, with a first metal of the at least two metals being the first of the two encapsulating adjacent elements.

3. The semiconductor device of claim 2, wherein the at least two metals form a metallic heater structure comprising the first metal forming a core encapsulated by a second metal such that a majority of a current flow through the metallic structure is through the first metal due to a resistance differential between the first metal and the second metal.

4. The semiconductor device of claim 3, wherein the first metal is Titanium Nitride and the second metal is Tantalum Nitride.

5. The semiconductor device of claim 2, wherein the at least two metals comprise Tantalum Nitride.

6. The semiconductor device of claim 2, wherein the at least two metals comprise Titanium Nitride.

7. The semiconductor device of claim 1, wherein the tapered structure is at least partially formed within a dielectric.

8. The semiconductor device of claim 1, wherein the tapered structure has a V-shape.

9. The semiconductor device of claim 1, wherein the tip portion extends within the center pore recess.

10. The semiconductor device of claim 1, wherein the volatile active material comprises Chalcogenide.

11. The semiconductor device of claim 1, wherein the semiconductor device is a Phase Change Memory (PCM) device.

12. The semiconductor device of claim 1, wherein the semiconductor device is a switching device.

* * * * *